(12) United States Patent
Hsu et al.

(10) Patent No.: US 8,822,833 B2
(45) Date of Patent: Sep. 2, 2014

(54) TOUCH SENSOR ASSEMBLY AND METHOD OF MAKING THE SAME

(71) Applicant: Cando Corporation, Hsin-Chu County (TW)

(72) Inventors: Fan Hsu, Hsin-Chu (TW); Chi-Kuang Lai, Taoyuan (TW)

(73) Assignee: Cando Corporation, Hsin-Chu County (TW)

( * ) Notice: Subject to any disclaimer, the term of this patent is extended or adjusted under 35 U.S.C. 154(b) by 144 days.

(21) Appl. No.: 13/681,651

(22) Filed: Nov. 20, 2012

(65) Prior Publication Data

US 2013/0133935 A1     May 30, 2013

(30) Foreign Application Priority Data

Nov. 25, 2011    (TW) ................................. 100143365

(51) Int. Cl.

| H05K 1/09 | (2006.01) |
|---|---|
| H05K 3/20 | (2006.01) |
| C23C 16/00 | (2006.01) |
| G06F 3/044 | (2006.01) |
| H05K 3/18 | (2006.01) |
| H05K 1/11 | (2006.01) |
| G06F 3/045 | (2006.01) |
| H05K 1/02 | (2006.01) |
| H05K 3/14 | (2006.01) |
| H05K 3/16 | (2006.01) |
| H05K 3/46 | (2006.01) |

(52) U.S. Cl.
CPC .................. *H05K 3/18* (2013.01); *H05K 1/092* (2013.01); *H05K 2201/0108* (2013.01); *G06F 3/044* (2013.01); *H05K 1/11* (2013.01); *H05K 3/146* (2013.01); *H05K 1/09* (2013.01); *G06F 3/045* (2013.01); *H05K 3/16* (2013.01); *H05K 1/0274* (2013.01); *H05K 3/4685* (2013.01)

USPC ............. 174/257; 174/261; 427/96.8; 29/831

(58) Field of Classification Search
USPC ................. 174/250, 255, 257, 261; 427/96.8; 29/831
See application file for complete search history.

(56) References Cited

U.S. PATENT DOCUMENTS

| 7,864,503 | B2 * | 1/2011 | Chang ........................... 361/288 |
|---|---|---|---|
| 2010/0295819 | A1 * | 11/2010 | Ozeki et al. ................... 345/174 |
| 2011/0290547 | A1 * | 12/2011 | Chen et al. .................... 174/261 |
| 2012/0080217 | A1 * | 4/2012 | Kim et al. ..................... 174/256 |
| 2012/0211264 | A1 * | 8/2012 | Milne ........................... 174/250 |

\* cited by examiner

*Primary Examiner* — Hoa C Nguyen (74) *Attorney, Agent, or Firm* — Trop Pruner & Hu, P.C.

(57) ABSTRACT

A method of making a touch sensor assembly comprises: forming conductive trace elements on a transparent substrate; forming an insulator layer on the transparent substrate such that the insulator layer covers a portion of the conductive trace elements; and forming a plurality of conductive bridging lines such that each of the conductive bridging lines bridges two corresponding ones of the conductive trace elements. Each of the conductive bridging lines includes a plurality of conductor layers stacked one above the other and differing from one another in reflectivity. One of the conductor layers is formed by reacting a reactive gas with a metallic material, and has a reflectivity less than that of the metallic material.

13 Claims, 8 Drawing Sheets

TOUCH SENSOR ASSEMBLY AND METHOD OF MAKING THE SAME

CROSS-REFERENCE TO RELATED APPLICATION

This application claims priority of Taiwanese application no. 100143365, filed on Nov. 25, 2011.

BACKGROUND OF THE INVENTION

1. Field of the Invention

This invention relates to a touch sensor assembly and a method of making the same, more particularly to a method of making a touch sensor assembly having a conductor layer formed by sputtering a metallic target in the presence of a reactive gas.

2. Description of the Related Art

Figure 1:
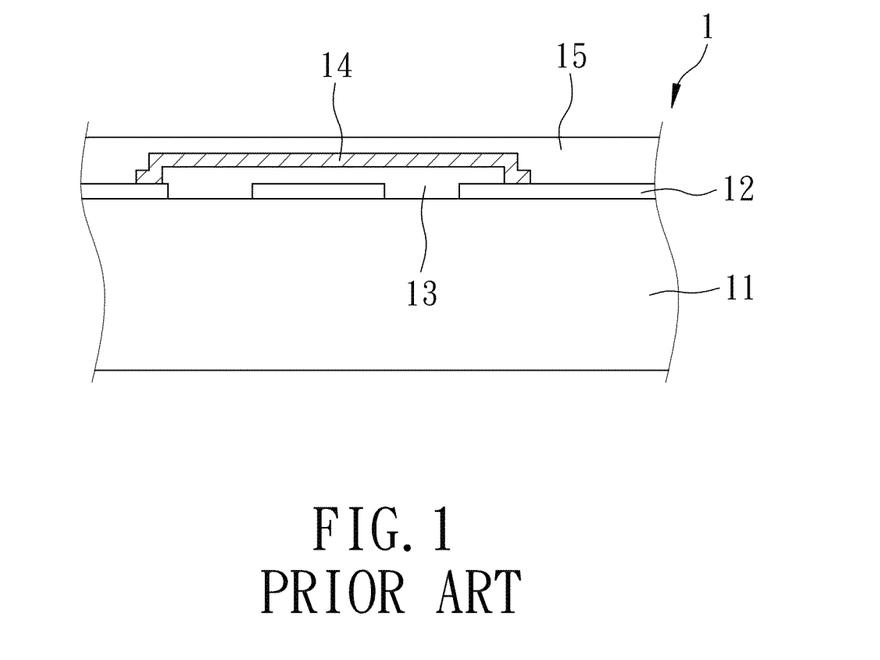
FIG. 1 is a fragmentary partly sectional view of a touch sensor assembly of a conventional touch panel.

FIG. 1 illustrates a touch sensor assembly of a conventional touch panel 1 for assembly with a display panel (not shown) to form a touch display. The touch sensor assembly includes a transparent glass substrate 11, a plurality of transparent conductive trace elements 12 spaced apart from each other, a transparent insulator 13 formed on the substrate 11 and covering a portion of the conductive trace elements 12, a plurality of conductive bridging lines 14 (only one bridging line is shown for the sake of clarity), and a transparent protective layer 15 formed on the bridging lines 14, the insulator 13 and the conductive trace elements 12. Each of the bridging lines 14 bridges two corresponding ones of the conductive trace elements 12 so as to form a touch sensor region on the substrate 11.

In order to obtain high touch sensitivity, the electrical resistance of the bridging lines 14 must be sufficiently low. Hence, the bridging lines 14 are normally made from metal, such as aluminum (Al), copper (Cu), Al-based alloys, and Cu-based alloys. In addition, any impurities present in the bridging lines 14 can cause a considerable increase in the electrical resistance thereof. Hence, formation of the bridging lines 14 is normally conducted by sputtering a metallic target in the presence of argon so as to prevent impurities from entering into the bridging lines 14. However, the bridging lines 14 thus formed have a high reflectivity and exhibit metallic luster, which is undesirable for the viewer when viewing the touch panel and which adversely affects the viewing quality of the touch panel. Hence, there is a need to reduce the visibility of the bridging lines 14 for achieving a better viewing quality.

SUMMARY OF THE INVENTION

Therefore, an object of the present invention is to provide a method of making a touch sensor assembly of a touch panel that can overcome the aforesaid drawback associated with the prior art.

According to one aspect of this invention, there is provided a method of making a touch sensor assembly. The method comprises: forming a plurality of conductive trace elements of a transparent conductive material on a transparent substrate; forming an insulator layer on the transparent substrate such that the insulator layer covers a portion of the conductive trace elements; and forming a plurality of conductive bridging lines such that each of the conductive bridging lines bridges two corresponding ones of the conductive trace elements. Each of the conductive bridging lines includes a plurality of conductor layers stacked one above the other and differing from one another in reflectivity. One of the conductor layers is formed by reacting a reactive gas with a metallic material, and has a reflectivity less than that of the metallic material.

According to another aspect of the present invention, there is provided a touch sensor assembly that comprises: a transparent substrate; a plurality of conductive trace elements formed on the substrate; an insulator layer formed on the substrate and covering a portion of the conductive trace elements; and a plurality of conductive bridging lines, each of which bridges two corresponding ones of the conductive trace elements. Each of the conductive bridging lines includes a plurality of conductor layers stacked one above the other and differing from one another in reflectivity. One of the conductor layers is formed by reacting a reactive gas with a metallic material, and has a reflectivity less than that of the metallic material.

BRIEF DESCRIPTION OF THE DRAWINGS

In drawings which illustrate an embodiment of the invention.

DETAILED DESCRIPTION OF THE PREFERRED EMBODIMENTS

Figure 2:
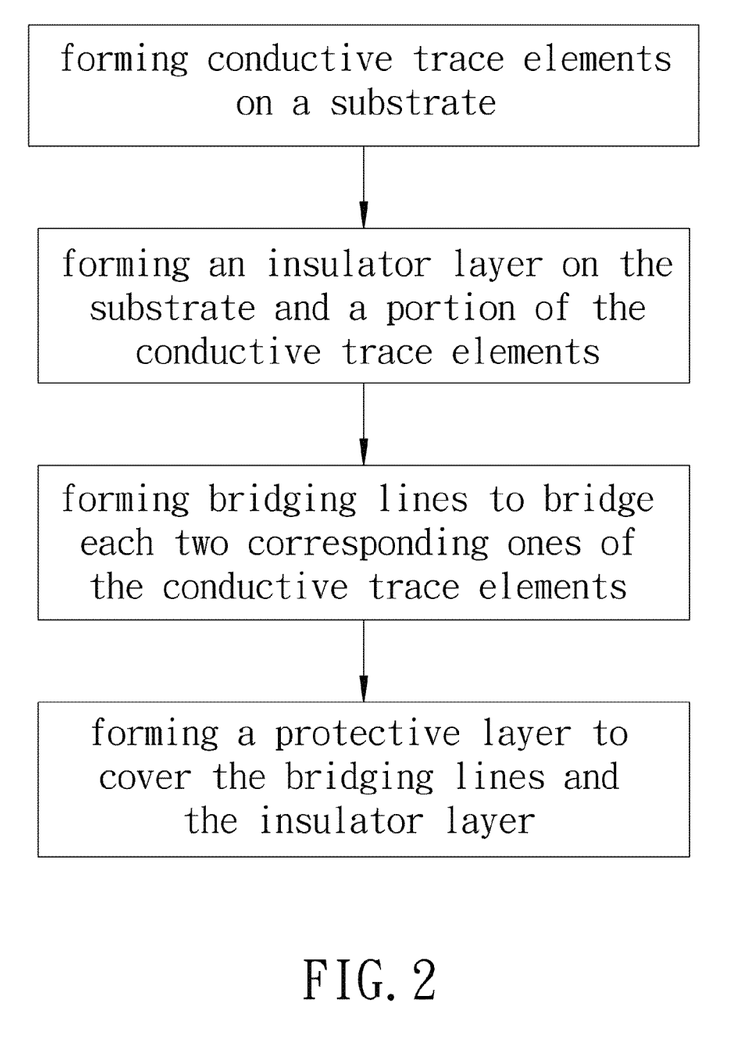
FIG. 2 is a flowchart illustrating consecutive steps of the preferred embodiment of a method of making a touch sensor assembly of a touch panel according to the present invention.

FIG. 2, in combination with FIGS. 3 to 6, illustrates consecutive steps of the preferred embodiment of a method of making a touch sensor assembly 3 of a touch panel according to the present invention. The touch panel can be assembled with a display panel (not shown) to form a touch display. The method comprises: forming a plurality of conductive trace elements 32 of a transparent conductive material on a transparent substrate 31 (see FIG. 3); forming an insulator layer 33 on the transparent substrate 31 (see FIG. 4) such that the insulator layer 33 covers a portion of the conductive trace elements 32; forming a plurality of conductive bridging lines 34 (see FIG. 5, only one bridging line is shown for the sake of clarity) such that each of the conductive bridging lines 34 is formed on the insulator layer 33 and bridges two corresponding ones of the conductive trace elements 32 so as to form a touch sensor region on the substrate 31; and forming a transparent protective layer 35 (see FIG. 6) such that the protective layer 35 covers the bridging lines 34, the insulator layer 33, and the conductive trace elements 32 that are exposed from the insulator layer 33.

Figure 5:
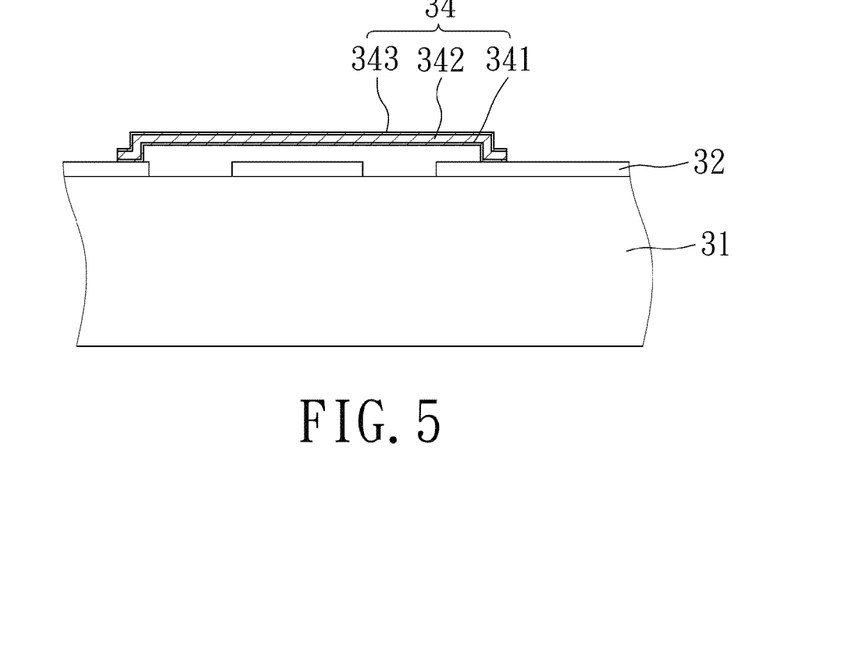

Each of the conductive bridging lines 34 includes a plurality of conductor layers 341, 342, 343 stacked one above the other, made from different materials and differing from one another in reflectivity and layer thickness so as to reduce the metallic luster and obtain a better viewing quality.

One of the conductor layers 341, 342, 343 (e.g., the conductor layer 341) is formed by reacting a reactive gas with a metallic material, and has a reflectivity less than that of the metallic material.

In this embodiment, the conductor layers 341, 342, 343 are made from Molybdenum (Mo)-containing metallic oxide, Aluminum (Al), and a Mo-containing metallic material, respectively. The conductor layer 341 that is made from Molybdenum (Mo)-containing metallic oxide is directly formed on the insulator layer 33 by sputtering a target of the Mo-containing metallic material in the presence of the reactive gas. The conductor layer 342 that is made from Al is directly formed on and entirely covers the conductor layer 341 that is made from the Mo-containing metallic oxide. Formation of the conductor layer 342 is conducted by sputtering a target of aluminum in the presence of argon. The conductor layer 343 that is made from the Mo-containing metallic material is directly formed on and entirely covers the conductor layer 342 that is made from Al. Formation of the conductor layer 343 is conducted by sputtering a target of the Mo-containing metallic material in the presence of argon.

The reactive gas is an oxygen-containing gas. Preferably, the oxygen-containing gas contains oxygen and argon, and the mole ratio of oxygen to argon ranges from 1:1 to 1:19 so as to obtain said one of the conductor layers 341 with a desired reflectivity and a reduced metallic luster.

In this embodiment, the Mo-containing metallic material is Molybdenum-Niobium (Mo—Nb) alloy, and the Mo-containing metallic oxide is Mo—Nb oxide. Hence, the conductor layer 341 is made from Mo—Nb oxide ($MoNbO_x$), in which x ranges from 2 to 3, the conductor layer 343 is made from Mo—Nb alloy, and each of the bridging lines 34 has a $MoNb/Al/MoNbO_x$ multilayered structure.

In another preferred embodiment, the Mo-containing metallic material is Mo, and the Mo-containing metallic oxide is Mo oxide. As such, each of the bridging lines 34 has a $Mo/Al/MoO_x$ multilayered structure.

Figure 3:
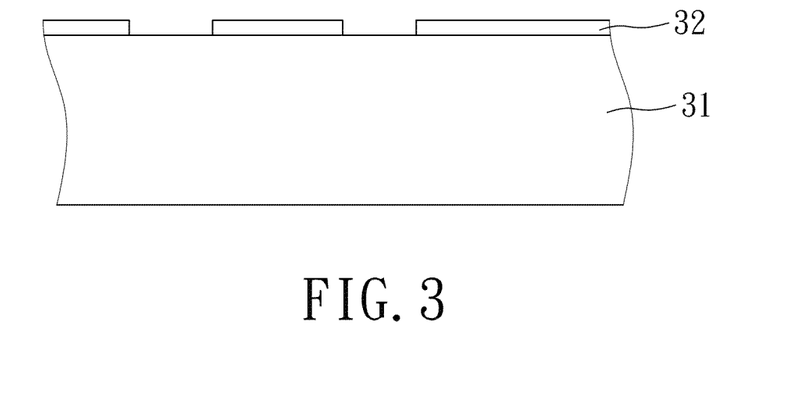
FIGS. 3 to 6 are fragmentary schematic views illustrating consecutive steps of the preferred embodiment.

Preferably, the transparent substrate 31 is made from a material, such as glass.

Preferably, the conductor layer 342 that is made from Al has a layer thickness greater than those of the remainder of the conductor layers 341, 343.

The conductive trace elements 32 are preferably made from a conductive material, such as indium-tin-oxide (ITO), and have a predetermined pattern according to a desired touch sensor layout.

Figure 4:
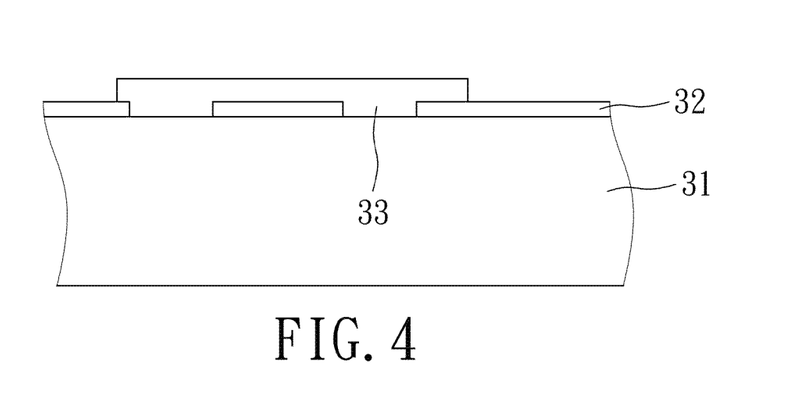

The insulator layer 33 is preferably made from a material, such as photoresists.

Figure 6:
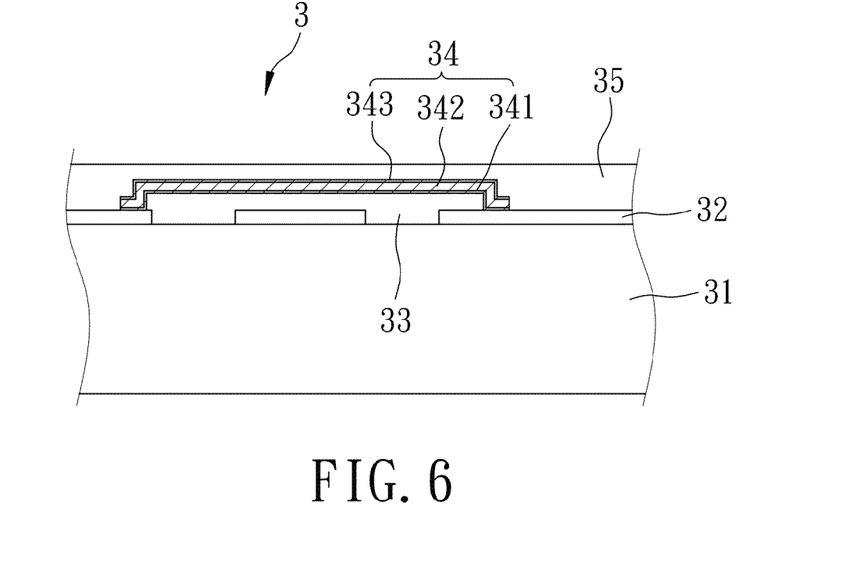

The protective layer 35 is preferably made from a material having a high hardness, such as photoresists and $SiO_2$.

Figure 7A:
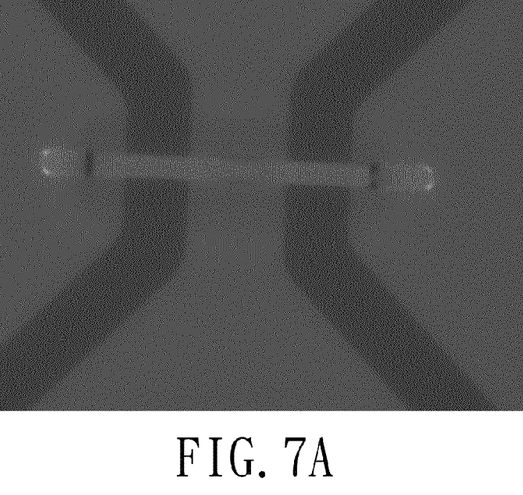
FIG. 7A is a photograph of a touch sensor assembly formed according to the method of this invention and having a bridging line with a MoNb/Al/MoNbO$_x$ multilayered structure.
Figure 7B:
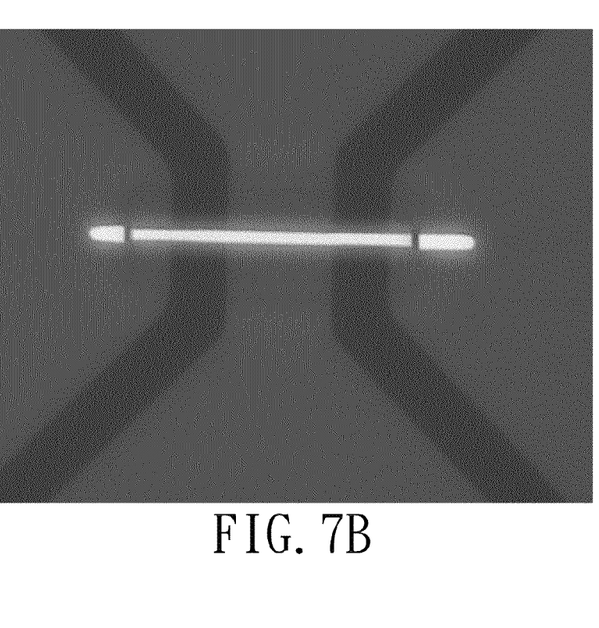
FIG. 7B is a photograph of a comparative example of a touch sensor assembly formed by a method similar to the method of this invention, except that the bridging line thus formed has a MoNb/Al/MoNb multilayered structure.
Figure 8:
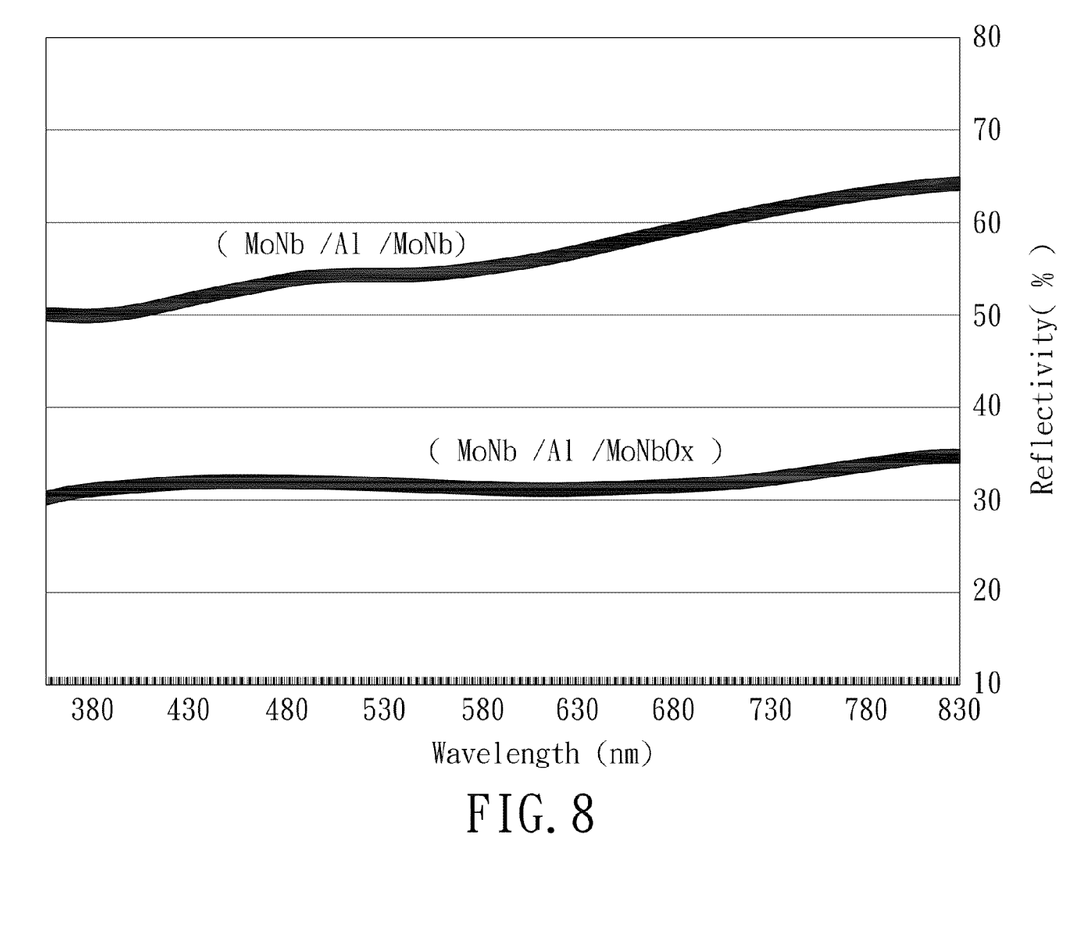
FIG. 8 is a graph showing two curves of measured reflectivity for the bridging line with the MoNb/Al/MoNbO$_x$ multilayered structure and the bridging line with the MoNb/Al/MoNb multilayered structure.

FIG. 7A is a photograph of a touch sensor assembly formed according to the method of this invention and having a bridging line with a $MoNb/Al/MoNbO_x$ multilayered structure and a width (or Critical Dimension (CD)) of 11 μm. FIG. 7B is a photograph of a comparative example of a touch sensor assembly formed by a method similar to the method of this invention, except that the bridging line thus formed has a MoNb/Al/MoNb multilayered structure and a width (or Critical Dimension (CD)) of 6.3 μm. FIG. 8 is a graph showing two curves of measured reflectivity (the reflectivity was measured using instrument Varian Cary-300, available from Varian Inc., U.S.A.) for the bridging line with the $MoNb/Al/MoNbO_x$ multilayered structure and the bridging line with the MoNb/Al/MoNb multilayered structure. The results show that the $MoNb/Al/MoNbO_x$ multilayered structure has a reflectivity (ranging from 30% to 35% in response to a wavelength from 350 nm to 830 nm) much less than that (ranging from 50% to 65% in response to a wavelength from 350 nm to 830 nm) of the MoNb/Al/MoNb multilayered structure. In addition, the metallic luster of the $MoNb/Al/MoNbO_x$ multilayered structure is considerably reduced as compared to that of the MoNb/Al/MoNb multilayered structure.

Figure 9A:
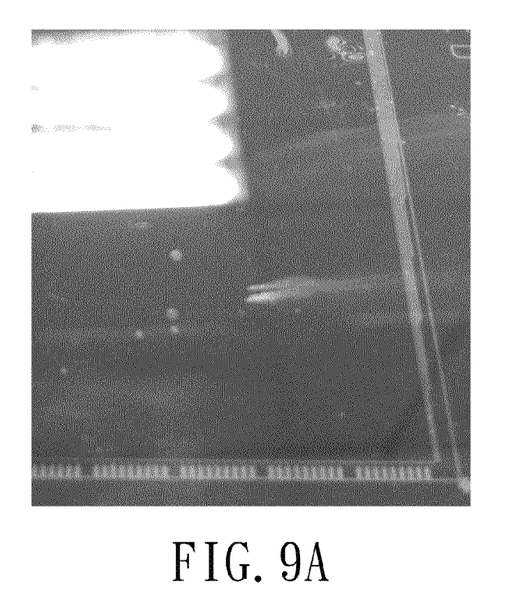
FIG. 9A is a photograph of a touch sensor assembly formed according to the method of this invention and having abridging line with a Mo/Al/MoO$_x$ multilayered structure.
Figure 9B:
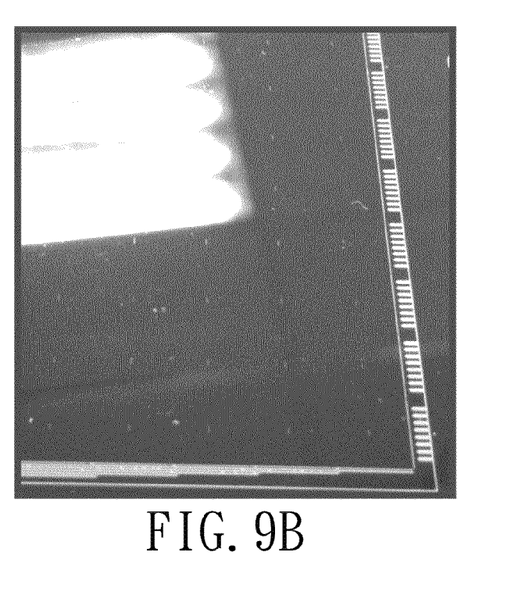
FIG. 9B is a photograph of a comparative example of a touch sensor assembly formed by a method similar to the method of this invention, except that the bridging line thus formed has a Mo/Al/Mo multilayered structure.
Figure 10:
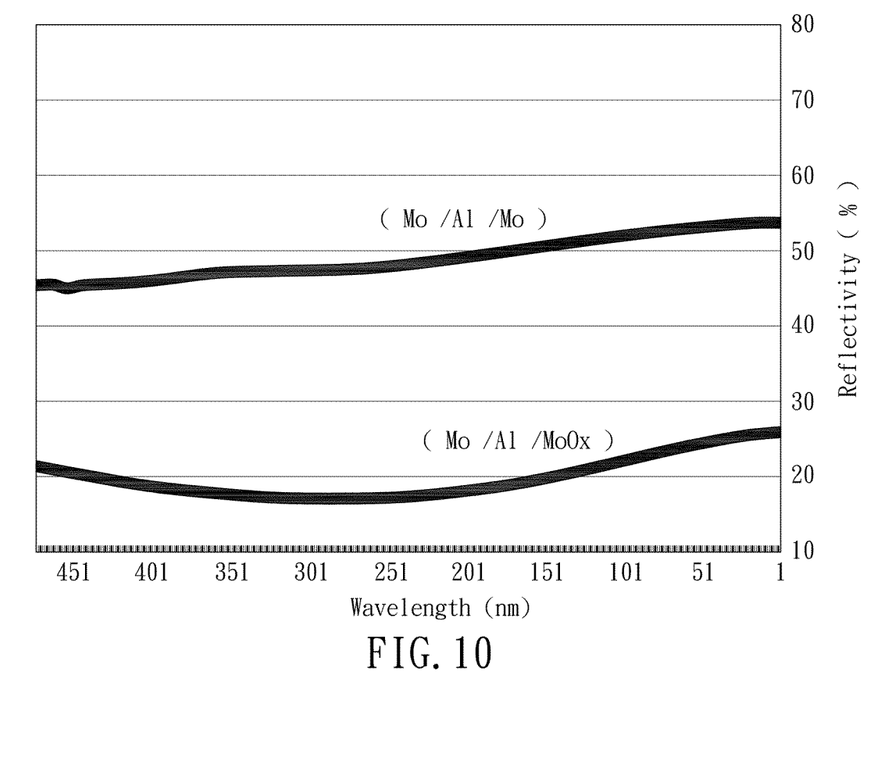
FIG. 10 is a graph showing two curves of measured reflectivity for the bridging line with the Mo/Al/MoO$_x$ multilayered structure and the bridging line with the Mo/Al/Mo multilayered structure.

FIG. 9A is a photograph of a touch sensor assembly formed according to the method of this invention and having a bridging line with a $Mo/Al/MoO_x$ multilayered structure. FIG. 9B is a photograph of a comparative example of a touch sensor assembly formed by a method similar to the method of this invention, except that the bridging line thus formed has a Mo/Al/Mo multilayered structure. FIG. 10 is a graph showing two curves of measured reflectivity (the reflectivity was measured using instrument Varian Cary-300, available from Varian Inc., U.S.A.) for the bridging line with the $Mo/Al/MoO_x$ multilayered structure and the bridging line with the Mo/Al/Mo multilayered structure. The results show that the $Mo/Al/MoO_x$ multilayered structure has a reflectivity (ranging from 9% to 19% in response to a wavelength from 1 nm to 460 nm) much less than that (ranging from 40% to 50% in response to a wavelength from 1 nm to 460 nm) of the Mo/Al/Mo multilayered structure. In addition, the metallic luster of the $Mo/Al/MoO_x$ multilayered structure is considerably reduced as compared to that of the Mo/Al/Mo multilayered structure.

By reacting the metallic material with a reactive gas to form one of the conductor layers 341 with a reflectivity lower than that of the metallic material according to the method of this invention, the aforesaid drawback associated with the prior art can be considerably alleviated.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A touch sensor assembly comprising:
   a transparent substrate;
   a plurality of conductive trace elements formed on said substrate;
   an insulator layer formed on said substrate and covering a portion of said conductive trace elements; and
   a plurality of conductive bridging lines, each of which bridges two corresponding ones of said conductive trace elements;
   wherein each of said conductive bridging lines includes a plurality of conductor layers stacked one above the other and differing from one another in reflectivity;
   wherein one of said conductor layers is formed by reacting a reactive gas with a metallic material, and has a reflectivity less than that of said metallic material.

2. The touch sensor assembly of claim 1, wherein said conductor layers are made from a Mo-containing metallic material, Al, and Mo-containing metallic oxide, respectively, said reactive gas being an oxygen-containing gas, said one of said conductor layers being made from Mo-containing metallic oxide and being formed by sputtering a target of said Mo-containing metallic material in the presence of said oxygen-containing gas.

3. The touch sensor assembly of claim 2, wherein said Mo-containing metallic material is Mo—Nb alloy, and said Mo-containing metallic oxide is Mo—Nb oxide.

4. The touch sensor assembly of claim 2, wherein said Mo-containing metallic material is Mo, and said Mo-containing metallic oxide is Mo oxide.

5. The touch sensor assembly of claim 2, wherein said conductor layer that is made from Al has a layer thickness greater than those of the remainder of said conductor layers.

6. The touch sensor assembly of claim 1, further comprising a transparent protective layer that covers said bridging lines, said insulator layer, and said conductive trace elements that are exposed from said insulator layer.

7. A method of making a touch sensor assembly, comprising:
forming a plurality of conductive trace elements of a transparent conductive material on a transparent substrate;
forming an insulator layer on the transparent substrate such that the insulator layer covers a portion of the conductive trace elements; and
forming a plurality of conductive bridging lines such that each of the conductive bridging lines bridges two corresponding ones of the conductive trace elements;
wherein each of the conductive bridging lines includes a plurality of conductor layers stacked one above the other and differing from one another in reflectivity;
wherein one of the conductor layers is formed by reacting a reactive gas with a metallic material, and has a reflectivity less than that of the metallic material.

8. The method of claim 7, wherein the conductor layers are made from a Mo-containing metallic material, Al, and Mo-containing metallic oxide, respectively, the reactive gas being an oxygen-containing gas, said one of the conductor layers being made from Mo-containing metallic oxide and being formed by sputtering a target of the Mo-containing metallic material in the presence of the oxygen-containing gas.

9. The method of claim 8, wherein the Mo-containing metallic material is Mo—Nb alloy, and the Mo-containing metallic oxide is Mo—Nb oxide.

10. The method of claim 8, wherein the Mo-containing metallic material is Mo, and the Mo-containing metallic oxide is Mo oxide.

11. The method of claim 8, wherein the oxygen-containing gas contains oxygen and argon, the mole ratio of oxygen to argon ranging from 1:1 to 1:19.

12. The method of claim 8, wherein the conductor layer that is made from Al has a layer thickness greater than those of the remainder of the conductor layers.

13. The method of claim 7, further comprising forming a transparent protective layer such that the protective layer covers the bridging lines, the insulator layer, and the conductive trace elements that are exposed from the insulator layer.

* * * * *